(12) United States Patent
Lim

(10) Patent No.: US 6,509,600 B2
(45) Date of Patent: Jan. 21, 2003

(54) FLASH MEMORY CELL

(75) Inventor: Min-Gyu Lim, Cheongju (KR)

(73) Assignee: Hyundai Electronis Industries Co., Ltd., Kyoungki-Do (KR)

(*) Notice: Subject to any disclaimer, the term of this patent is extended or adjusted under 35 U.S.C. 154(b) by 0 days.

(21) Appl. No.: 09/854,519

(22) Filed: May 15, 2001

(65) Prior Publication Data

US 2002/0031886 A1 Mar. 14, 2002

Related U.S. Application Data

(62) Division of application No. 09/190,283, filed on Nov. 13, 1998, now Pat. No. 6,265,265.

(30) Foreign Application Priority Data

Nov. 13, 1997 (KR) .............................. 97-59597

(51) Int. Cl.[7] .................................. H01L 27/108
(52) U.S. Cl. ................... 257/301; 257/314–324; 257/900
(58) Field of Search ....................... 257/301–315, 257/316, 317, 318, 319, 320, 321, 322, 323, 324, 900

(56) References Cited

U.S. PATENT DOCUMENTS

5,637,897 A * 6/1997 Oyama ....................... 257/320
5,838,039 A * 11/1998 Sato et al. .................. 257/321

* cited by examiner

Primary Examiner—Matthew Smith
Assistant Examiner—V. Yevsikov
(74) Attorney, Agent, or Firm—Birch, Stewart, Kolasch & Birch, LLP

(57) ABSTRACT

The present invention relates to a flash memory cell and fabricating method therefore, including a semiconductor substrate having first type impurity, a first gate insulating layer on a first certain part of the semiconductor substrate, a buried insulating layer on a second certain part of the semiconductor substrate, the buried insulating layer being connected to the first gate insulating layer, a floating gate on the first gate insulating layer wherein the floating gate extends on and is overlapped with the buried insulating layer in part, a second gate insulating layer on the floating gate, a third gate insulating layer at a lateral surface of the floating gate, a control gate on the second gate insulating layer wherein one side of the control gate corresponds to that of the floating gate and the other side of the control gate does not correspond to that of the control gate and the one side of said control gate overlaps over the buried insulating layer, a fourth gate-insulating layer on the control gate, an insulating sidewall spacer at a lateral surface of the control gate and a lateral surface of the fourth gate insulating layer wherein the insulating sidewall spacer lies over the buried insulating layer, an erasing gate on the buried insulating layer, an erasing gate on the buried insulating layer wherein the erasing gate is separated electrically from the floating gate and said control gate by the third gate insulating layer, the insulating sidewall spacer the fourth gate insulating layer, and a source region under both buried insulating layer and one side of the floating gate wherein the source region has a second type impurity.

15 Claims, 4 Drawing Sheets

FLASH MEMORY CELL

This application is a divisional continuation-in-part, of Application No. 09/190,283, filed on Nov. 13, 1998 now U.S. Pat. No. 6,265,265, the entire contents of which are hereby incorporated by reference and for which priority is claimed under 35 U.S.C. § 120; and this application claims priority of Application No. 1997-59597 filed in Republic of Korea on Nov. 13, 1997 under 35 U.S.C. § 119.

BACKGROUND OF THE INVENTION

1. Field of Invention

The present invention relates to a flash memory cell and fabricating method thereof, and more particularly, to a flash memory cell for tunneling electrons stored in a floating gate with an erasing gate, and a method of fabricating of the same.

2. Discussion of the Related Art

A flash memory cell is an inactive memory device having a floating gate and a control gate, the control gate being positioned over the floating gate. The memory cells of an array of flash memory cells are erased simultaneously and the speed of erasing is extremely fast.

To program a flash memory cell, hot-electrons are injected into the channel by applying high voltage to the control gate and into the floating gate. A coupling ratio is defined by, the voltage applied to the floating gate over the other voltage applied to the control gate. The more the coupling ratio increases, the more efficient the program becomes.

The flash memory, cell is erased by injecting the electrons of the floating gate into the source region of the semiconductor substrate to which high voltage is applied according to the tunneling mechanism of Fowler-Nordheim. Moreover, the erasing operation can be achieved by tunneling the electrons stored in the floating gate into the erasing gate with an extra floating gate.

The thickness of the portion of the gate insulating film lying under the floating gate is decreased to improve the efficiency of the erasing operation. The decreased thickness of the film effectively lowers the voltage applied to the floating gate due to the decreased coupling ratio. Hence, the efficiency of the erasing operation for the programming is increased while the coupling ratio is maintained.

FIG. 1 shows a cross-sectional view of a conventional flash memory cell. To fabricate the flash memory cell of FIG. 1, a floating gate 15 is formed having a gate insulating layer 13 underneath. To form the floating gate 15, a polycrystalline layer doped with impurities is patterned. After forming floating gate 15, a control gate 19 is formed on floating gate 15, a second gate insulating layer 17 being formed therebetween, wherein the control gate 19 is defined to have a striped pattern that is crossed by the direction of channel length. Thereafter, a sidewall spacer 25 is formed at the lateral surface of the first gate insulating layer 13, the floating gate 15, the second gate insulating layer 17 and the control gate 19.

A source region 27 and a drain region 29, which are doped heavily with N-type impurities, are then formed in the substrate 11 under both sides of the floating gate 15. A lightly doped region 23 with an N-type impurity is formed immediately below the source region 27 in the semiconductor substrate 11. The First, a gate voltage Vg of 12 V is applied to the control gate 19, a drain voltage Vd of 5 to 6 V is applied to the drain region 29 while the source region 27 is grounded. Thus, a channel is formed under the floating gate 15 in the semiconductor substrate 11 by the gate voltage Vg which has been applied to the control gate 19, and electrons accelerated by the drain voltage Vd applied to the drain region 29 are injected into the floating gate 15 over the energy barrier of the first gate insulating layer 13. Since the threshold voltage of the cell has increased based on the injection of electrons into the floating gate 15, programming is completed.

However, when operated in this manner, the efficiency of the programming depends on the value of the voltage induced from the gate voltage Vg which has been applied to the control gate 19. Namely, the larger the coupling ratio determined by the voltage induced to the floating gate 15 over the gate voltage Vg applied to the control gate 19, the more efficient the programming becomes. The coupling ratio increases provided the capacitance of the first gate insulating layer 13 is relatively small or the capacitance of the second gate insulating layer 17 is relatively large. Hence the second insulating layer 17 is formed with a structure of O—N—O (oxide-nitride-oxide) layer to increase its capacitance.

In order to erase data programmed in the flash memory cell, the electrons in the floating gate 15 are tunneled into the heavily-doped source region 27 by applying a source voltage Vs of greater than 15 V to the lightly-doped source region 23 while the control gate 19 is grounded or provided with negative voltage. The electrons migrate from the floating gate 15 to the source region 27 through the first gate insulating layer 13 based on Fowler-Nordheim tunneling, thereby lowering the threshold voltage of the cell and erasing the cell. In addition, the lightly-doped source region 23 prevents the application of high voltages to the heavily doped source region 27 during junction breakdown since it diffuses the junction deeply. The first gate insulating layer 13 is formed thinly in order to improve the efficiency for erasing the cell since the electrons migrate from the floating gate 15 to the heavily doped source region 27 through the first gate insulating layer 13.

FIGS. 2A to 2D show a cross-sectional view of steps in the process of fabricating the above-described flash memory cell according to the prior art.

Referring to FIG. 2A, a first gate insulating layer 13 is formed by thermal oxidation of the surface of a P-type semiconductor substrate 11. A polycrystalline silicon layer doped with impurity is deposited on the first gate insulating layer 13 with CVD (Chemical Vapor Deposition). A floating gate 15, which has a striped pattern in a first direction determined by the channel length, is formed by patterning the polycrystalline silicon layer via photolithography.

Referring to FIG. 2B, a second gate insulating layer 17 comprising oxide-nitride-oxide is formed to cover the floating gate 15. A control gate 19 is then formed on the second gate insulating layer 17 by depositing polycrystalline silicon doped with an impurity by CVD.

Referring to FIG. 2C, the control gate 19, the second gate insulating layer 17, the floating gate 15 and the first gate insulating layer 13 are sequentially patterned, via photolithography, in a second direction defined perpendicular to the first direction. A photoresist pattern 21 exposing a certain part of the semiconductor substrate 11 is then defined, and a lightly-doped region 23 is formed by implanting an N-type impurity into the exposed part of the semiconductor substrate 11. The exposed part of the substrate 11, into which regions 23 is formed, is not protected by the photoresist pattern 21 which acts as a mask. The edge of the lightly-doped region 23 overlaps part of the floating gate 15 due to diffusion and the like.

Referring to FIG. 2D, the photoresist pattern 21 is removed, and an oxide is deposited on the semiconductor substrate 11 with CVD to cover the control gate 19. Then, a sidewall spacer 25 is formed at the lateral surfaces of the first gate insulating layer 13, the floating gate 15, the second insulating layer 17 and the control gate 19. Using the control gate 19 and the sidewall spacer 25 as a mask, a source region 27 and a drain region 29 are formed by implanting large amounts of an N-type impurity into the semiconductor substrate 11, wherein the source region 27 is positioned over the lightly-doped region 23.

However, through this process, the efficiency of the programming decreases due to the decline of the coupling ratio since the capacity of the first gate insulating layer is enhanced by its thin construction, a construction that is used by the conventional system to improve the erasing efficiency.

Additionally, the reliability of the conventional flash memory cell is poor since the data programmed in the floating gate may be erased by the drain voltage, and the construction is complicated since it is difficult to form the first. insulating layer thinly. Moreover, the dimensions of the device increases and the process becomes further complicated in an erasing operation since the lightly-doped region 23 is necessary for preventing the destruction of the source junction from the high voltage applied to the source region.

SUMMARY OF THE INVENTION

An object of the present invention is to provide a flash memory cell and fabricating method thereof that substantially obviates one or more of the problems due to limitations and disadvantages of the related art.

It is an object of the prevent invention to provide a flash memory cell which improves efficiency of programming by increasing the coupling ratio while preventing a decline in the efficiency of the erasing operation.

Another object of the present invention is to provide flash memory cell having reduced dimensions.

Another objection of the present invention is to provide a method of fabricating a flash memory cell based on less steps for fabricating, and a flash memory cell that is formed without an extra region to prevent the source junction from destruction.

A further object of the present invention is to simplify the method of fabricating a flash memory cell by forming a thick first gate insulating layer.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention includes a semiconductor substrate having a first type impurity, a first gate insulating layer on a first certain part of the semiconductor substrate, a buried insulating layer on a second certain part of the semiconductor substrate, the buried insulating layer being connected to the first gate insulating layer, a floating gate on the first gate insulating layer wherein the floating gate extends on and is overlapped with the buried insulating layer in part, a second gate insulating layer on the floating gate, a third gate. insulating layer at a lateral surface of the floating gate, a control gate on the second gate insulating layer wherein one side of the control gate corresponds to that of the floating gate and the other side of the control gate does not correspond to that of the control gate and the one side of said control gate overlaps over the buried insulating layer, a fourth gate insulating layer on the control gate, an insulating sidewall spacer at a lateral surface of the control gate and a lateral surface of the fourth gate insulating layer wherein the insulating sidewall spacer lies over the buried insulating layer, an erasing gate on the buried insulating layer wherein the erasing gate is separated electrically from the floating gate and said control gate by the third gate insulating layer the insulating sidewall spacer the fourth gate insulating layer, and a source region under both buried insulating layer and one side of the floating gate wherein the source region has a second type impurity.

The above-explained structure does not require a lightly-doped region which prevents the breakdown of the source junction, decreasing the bulk of a device.

In another aspect of the present invention, a method of fabricating flash memory cell includes the steps of implanting a second type impurity heavily into a certain part of a semiconductor substrate of a first type impurity, forming both a first gate insulating layer and a buried insulating layer by means of oxidizing a surface of the semiconductor substrate including the certain part, forming a source region by means of diffusing the second type impurity during the oxidizing process, forming a floating gate on the gate insulating layer to a first direction wherein the floating gate has a striped pattern, forming a second gate insulating layer on a certain portion of the floating gate wherein the second gate insulating layer has a striped pattern to a second direction perpendicular to the. floating gate, forming a control gate on the second gate insulating layer, forming a capping insulating layer on the control gate, forming an insulating sidewall spacer at lateral surfaces of the second insulating layer/the control gate/the capping insulating layer wherein the lateral surfaces lies over to the buried insulating layer, patterning the first gate insulating layer and the control gate in use of the capping insulating layer and the insulating sidewall spacer, forming a third gate insulating layer at a lateral surface of the floating gate, forming a drain region in a disclosed part of the semiconductor substrate wherein the drain region has a second type impurity, and forming an erasing gate over the buried insulating layer.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF PREFERRED EMBODIMENT

Reference will now be made in detail to the preferred embodiments of the present invention, examples of which are illustrated in the accompanying drawings.

Figure 1:
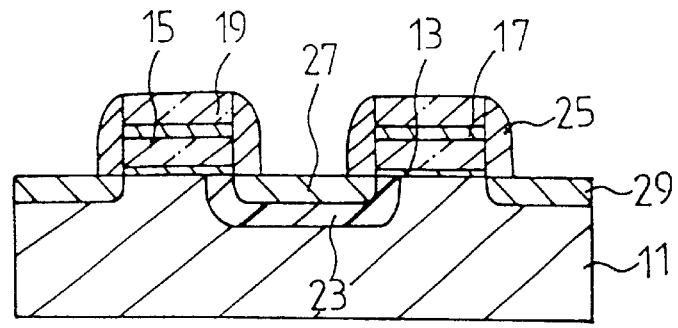
FIG. 1 is a cross-sectional view of a flash memory cell according to the prior art.
Figure 2A:
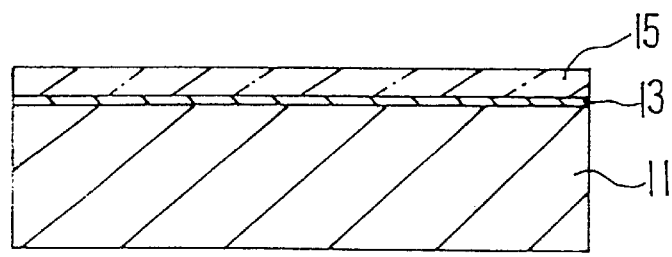
FIG. 2A to FIG. 2D show each step of the process for fabricating flash memory cell according to the prior art.
Figure 2B:
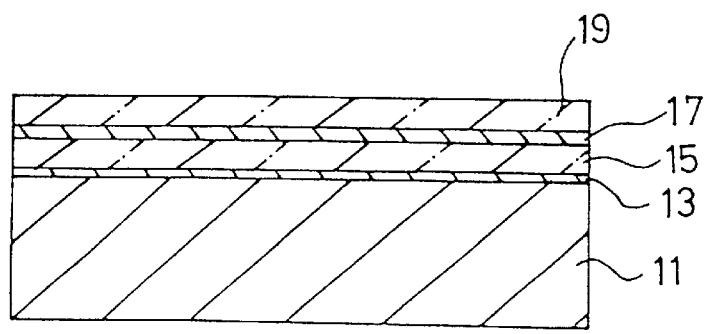
Figure 2C:
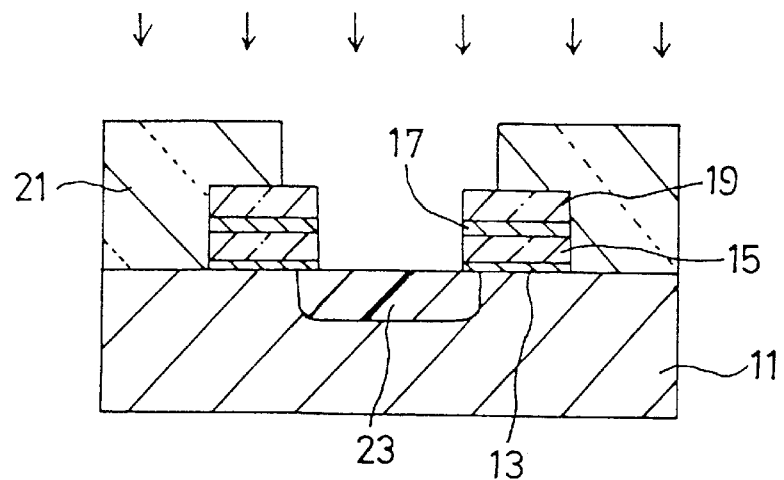
Figure 2D:
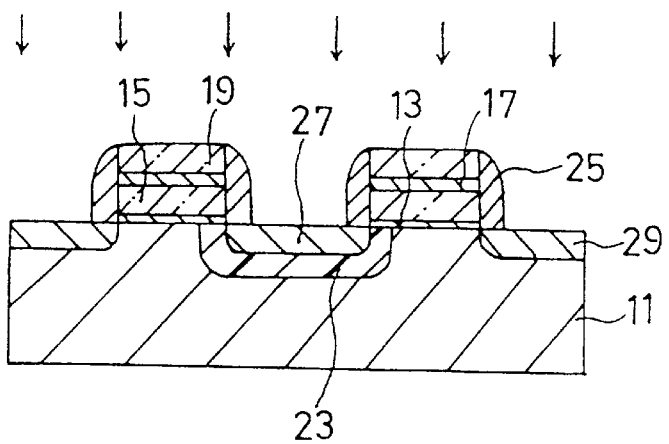
Figure 3:
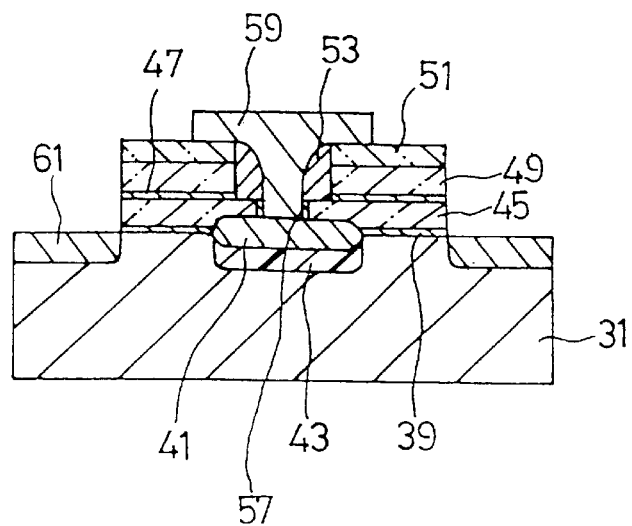
FIG. 3 is a cross-sectional view of a flash memory cell according to the present invention.

FIG. 3 is a cross-sectional view of flash memory cell according to the present invention. The flash memory cell according to the present invention includes a semiconductor substrate 31, first 39, second 47 and third gate insulating layers 57, a buried insulating layer 41, a floating gate 45, a control gate 49, an erasing gate 59, a source region 43, a drain region 61, capping oxide layer 51, and sidewall spacer 53.

The source region 43 and drain region 61 doped with an N-type impurity are formed in the semiconductor substrate 31, the space between the source region 43 and the drain region 61 in the semiconductor substrate 31 defining the channel.

The first gate insulating layer 39 is formed on the channel in the semiconductor substrate 31, and the buried insulating layer 41 is formed above the source region 43 in the semiconductor substrate 31. The first gate insulating layer 39 and the buried insulating layer 41 are formed simultaneously with thicknesses of 200–400 Å and 1000–2000 Å, respectively, by thermal oxidation. The floating gate 45 is formed on the first gate insulating layer 39, overlapping a portion of the buried insulating layer 41.

The second gate insulating layer 47 is formed on the floating gate 45, and the control gate 49 is formed on the second gate insulating layer 47. The second gate insulating layer 47 has a structure of either oxide or oxide-nitride-oxide and the thickness of 200–300 Å. The floating gate 45 is formed with an impurity doped polycrystalline silicon. The floating gate 45 has a thickness of 2000–3000 Å and has a striped pattern crossing a direction defined by the channel length. Viewing the cell from a cross-sectional direction of channel length, the end of the control gate 49 positioned closest to drain region 61 is aligned with a corresponding end of the floating gate 45, while the other end of the control gate 49, which is positioned closest to the source region 43, overlaps a portion of buried oxide 41 and does not correspond to the other end of the floating gate 45.

A capping oxide 51 layer is formed on the control gate 49. The third insulating layer 57 and a sidewall spacer 53 are formed at the lateral surfaces of the floating gate 45 and the control gate 49, respectively. The erasing gate 59 is formed on the buried oxide 41. The erasing gate 59 is therefore electrically separated from control gate 49 by the capping oxide layer 51 and the sidewall spacer 53. In addition, erasing gate 59 is electrically separated from floating gate 45 by sidewall spacer 53 and third gate insulating layer 57.

Programming in the above-explained structure of the flash memory cell is performed as follows. A gate voltage Vg of about 12 V is applied to the control gate 49, and a drain voltage Vd of 5 to 6 V is applied to the drain region 61 while the source region 43 is grounded. Specifically, based on the gate voltage Vg applied to the control gate 49 a channel may be formed in the semiconductor substrate 31 under the floating gate 45. Then, the electrons that are accelerated by the drain voltage Vd applied to the drain region 61 exceed the energy barrier of the first gate insulating layer 39, and are therefore injected into the floating gate 45, causing the cell to be programmed based on the corresponding rise of threshold voltage.

Because first gate insulating layer 39 is formed with a thickness (200–400 Å) that is similar to the thickness of second gate insulating layer 47 (200–300 Å), which is thick relative to the first gate insulating layer 13 (tunneling oxide, 80–100 Å) used in conventional flash memory cells, the capacitance of the first gate insulating layer 39 is relative small. That is, the first gate insulating layer 39 of the present invention is thicker than the first gate insulating layer 13 of the conventional art (tunneling oxide). Thus, the present invention has an improved coupling ratio, comparing with the conventional art.

Coupling ratio=$Cox_2/(Cox_1+Cox_2)$;

Cox=dielectric constant * (A/T)

Cox: capacitance of oxide (insulating layer);

A: area of oxide (insulating layer);

T: thickness of oxide (insulating layer)

Based on the foregoing formula, the coupling ratio may be increased, since the capacitance of the first gate insulating layer $Cox_1$ is decreased according as the first gate insulating layer is thicker than that of the conventional art.

Accordingly, the coupling ratio is increased, causing a corresponding increase in the efficiency of programming. Specifically, the magnitude of a voltage induced at the floating gate 45 based on a gate voltage Vg applied to the control gate 49 increases.

If the control gate 49 is grounded or subject to application of a negative voltage to erase the programmed data, the electrons in the floating gate 45 are tunneled into the source region 43 through third gate insulating layer 57 by-applying a high voltage over (e.g., 15 V) to the erasing gate 59. That is, to erase programmed data, electrons in floating gate 15 are discharged directly to erasing gate 59 through third gate insulating layer 57, rather than discharging those electrons through first gate insulating layer 39. Thus, thickness of third gate insulating layer 57 and first gate insulating layer 39 can be independently adjusted to improve the efficiency of the erasing and programming operations, respectively. Therefore, the efficiency of the erasing operation improves due to the concentration of electric field at the edge of the floating gate 45 as the electrons migrate from the floating gate 45 to the erasing gate 59 through the third gate insulating layer 57. And then the cell is erased due to the decline of threshold voltage.

A junction-breakdown is also prevented due to the shallow junction of the source region 43 since the erasing operation is carried out by applying high voltage over 15 V to the erasing gate 53.

FIGS. 4A to 4E show steps performed in the process of fabricating the flash memory cell according to the present invention.

Figure 4A:
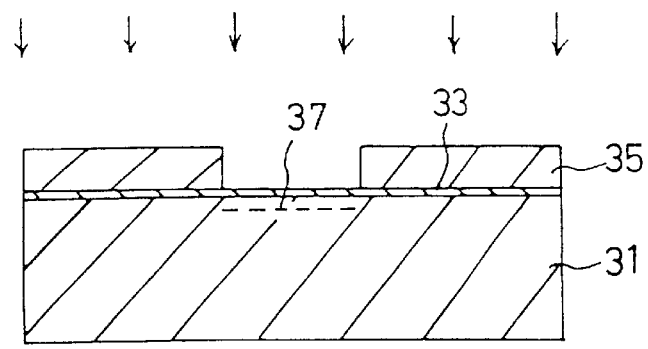
FIG. 4A to FIG. 4E show steps performed in the process of fabricating a flash memory cell according to the present invention.

Referring to FIG. 4A, a pad oxide layer 33 is formed by oxidizing thermally the surface of a P-type semiconductor substrate 31. A photoresist pattern 35 is formed on the pad oxide layer 33, exposing a portion of the oxide layer 33. Using the photoresist pattern 35 as a mask, an ion-implanted region 37 is formed by implanting an N-type impurity, such as As, P and the like, heavily into the semiconductor substrate 31.

Figure 4B:
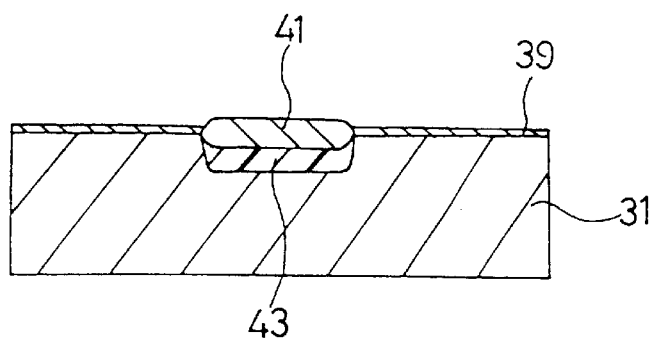

Referring to FIG. 4B, the surface of the semiconductor substrate 31 is again exposed by sequentially removing the photoresist pattern 35 and the pad oxide layer 33. The first gate insulating layer 39 is then formed with a thickness of 200–400 Å by thermally oxidizing the surface of the semiconductor substrate 31. The ion-implanted region 37 is oxidized more rapidly than the rest of the surface of the semiconductor substrate 31 since its lattice is damaged.

Accordingly, a buried insulating layer 41 thicker than the first gate insulating layer 39 is formed with a thickness of 1000–2000 Å, which is, at the ion-implanted region 37.

A source region 43 is also formed under the buried insulating layer 41 by diffusing the impurity of the ion-implanted region 37 using the heat in a thermal oxidation process.

Figure 4C:
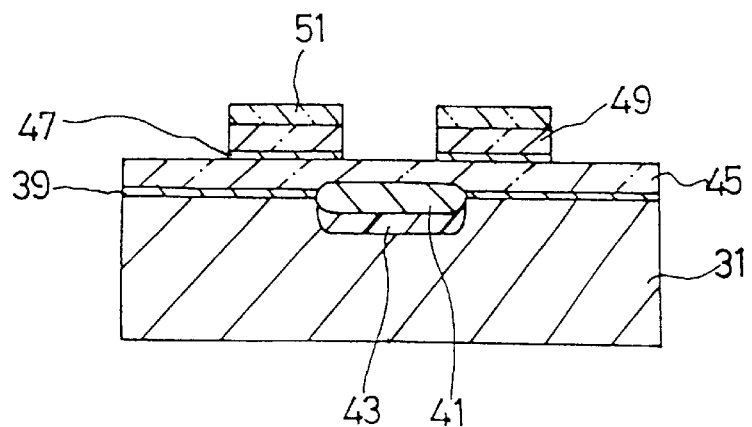

Referring to FIG. 4C, polycrystalline silicon doped with impurity is deposited with CVD on both the first gate insulating layer 39 and the buried insulating layer 41. Then, a floating gate pattern 45 is formed having a striped pattern in a first direction defined by channel length by removing a certain portion of the deposited polycrystalline silicon with photolithography. A second gate insulating layer 47 is formed on the floating gate pattern 45 of either oxide or ONO.

Thereafter, polycrystalline silicon and an oxide are sequentially deposited on the second insulating layer 47 with CVD. Then, a control gate 49 and a capping oxide layer 51 are defined by sequentially patterning the above-deposited polycrystalline, silicon and oxide, via photolithography, in a second direction defined perpendicular to the first direction. Subsequently, only the portion of the second gate insulating layer 47 protected by the control gate 49 remains. If necessary, an additional etching process may be performed to achieve this structure.

Figure 4D:
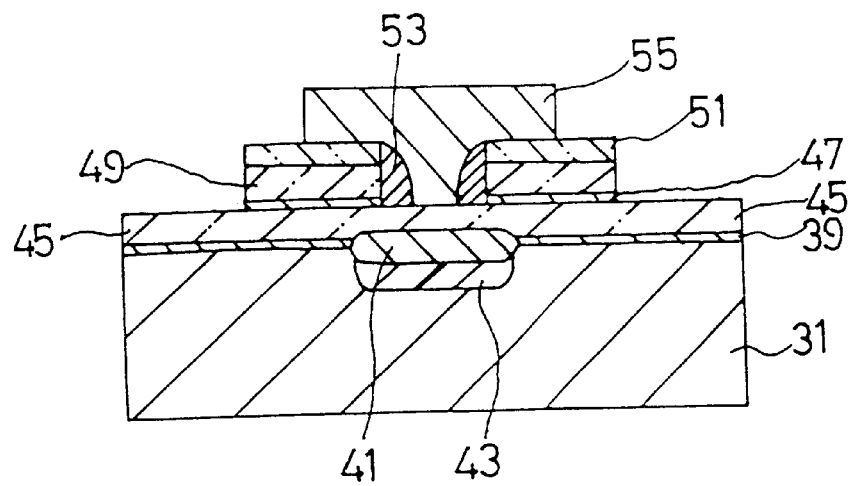

Referring to FIG. 4D, oxide is deposited on the floating gate 45 and the capping oxide 51. Then, sidewall spacers 53 are formed at the lateral surfaces of the capping oxide 51, the control gate 49 and the second insulating layer 47 by etching back the deposited oxide.

Thereafter, a photoresist pattern 55 is formed on the remaining sidewall spacer 53 lying over the buried insulating layer 41, on the disclosed surface of the buried insulating layer 41 and on the portion of the capping oxide 51. The photoresist is pattered by an exposing and developing process after the photoresist pattern 55 has been applied on the second gate insulating layer 47. Using the photoresist pattern 55 as a mask, portions of the sidewall spacers, which are not shown in the drawing and not protected by the photoresist pattern 55, are removed by wet etching.

Figure 4E:
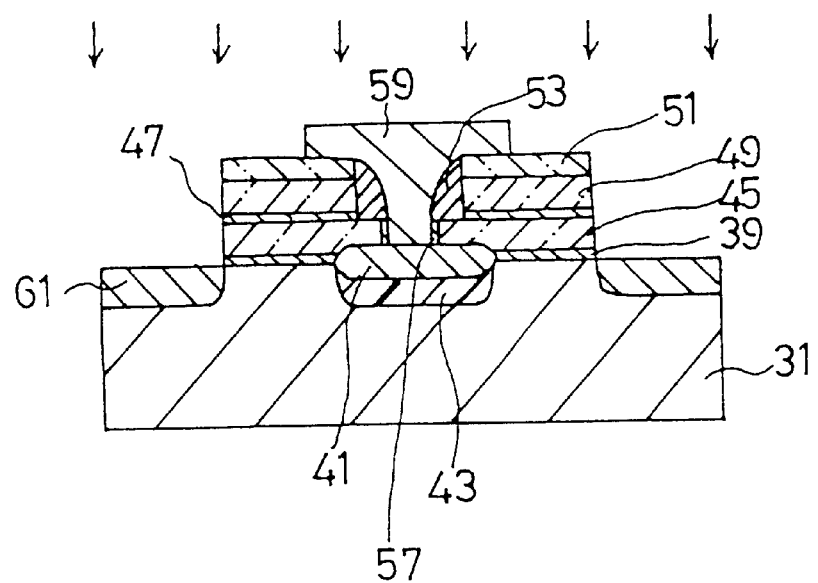

Referring to FIG. 4E, the photoresist pattern 55 is removed. Using both capping oxide 51 and sidewall spacer 53, the second gate insulating layer 47, the floating gate pattern 45 and the first gate insulating layer 39 are patterned via photolithography to disclose a portion of the surface of the semiconductor substrate 31 and the buried insulating layer 41, wherein the floating gate 45 is completed. Then, a third gate insulating layer 57 is formed at the lateral surface of the floating gate 45 by thermal oxidation.

Polycrystalline silicon doped with impurity is deposited on the above-mentioned structure via CVD. Then, an erasing gate 59 is formed by patterning the deposited polycrystalline silicon such that portion positioned over the buried oxide layer 41 remains, wherein the erasing gate is separated electrically from the floating gate 45 by the third gate insulating layer 57 and from the control gate 49 by the capping oxide layer 51 and the sidewall spacer 53.

A drain region 61 is then formed by implanting N-type impurity ions, such as As, P and the like, heavily into the disclosed surface of the semiconductor substrate 31. The drain region 61 may alternatively be formed before the erasing gate 59 is formed.

Therefore, the present invention provides a flash memory cell which improves the efficiency of the programming by increasing the coupling ratio as well as preventing the decline of the efficiency of the erasing operation, a flash memory cell having decreased dimensions, a method of fabricating flash memory cell in which the number of steps are decreased since an extra region need not be formed to prevent the source junction from destruction, and a simple method of fabricating a flash memory cell by forming the first gate insulating layer thick.

It will be apparent to those skilled in the art that various modification and variations can be made in flash memory cell and fabricating method thereof of the present invention without departing from the spirit or scope of the inventions. Thus, it is intended that the present invention cover the modifications and variations of this invention provided they come within the scope of the appended claims and their equivalents.

What is claimed is:

1. A flash memory cell comprising:
    a semiconductor substrate having a first type impurity;
    a drain region positioned at a surface region of said semiconductor substrate;
    a first gate insulating layer positioned on a first part of said semiconductor substrate;
    a buried insulating layer positioned on a second part of said semiconductor substrate, said buried insulating layer being connected to said first gate insulating layer;
    a floating gate positioned on at least said first gate insulating layer, said floating gate extending over at least a part of said buried insulating layer;
    a second gate insulating layer positioned on said floating gate;
    a third gate insulating layer at a lateral surface of said floating gate;
    a control gate positioned on said second gate insulating layer, a first side of said control gate being aligned with a first side of said floating gate and a second side of said control gate being misaligned with a second side of said control gate, said second side of said control gate overlapping at least a portion of said buried insulating layer;
    a fourth gate insulating layer positioned on said control gate;
    an insulating sidewall spaced at a lateral surface of said control gate and a lateral surface of said fourth gate insulating layer, said insulating sidewall spacer positioned over at least a position of said buried insulating layer;
    an erasing gate positioned on said buried insulating layer, said buried insulating layer completely covering a source region, said erasing gate being electrically separated from said floating gate and said control gate by said third gate insulating layer, said insulating sidewall spacer and said fourth gate insulating layer; and
    a source region positioned under said buried insulating layer and said second side of said floating gate, said source region having a second type impurity.

2. The flash memory cell according to claim 1, wherein said first gate insulating layer has a thickness of 200–400 Å.

3. The flash memory cell according to claim 1, wherein said buried insulating layer has a thickness of 1000–2000 Å.

4. The flash memory cell according to claim 2, wherein said first gate insulating layer and said buried insulating layer are formed simultaneously by thermal oxidation.

5. The flash memory cell according to claim 1, wherein said second gate insulating layer has a structure of at least one of oxide and oxide-nitride-oxide.

6. The flash memory cell according to claim 5, wherein said second gate insulating layer has a thickness of 200–300 Å.

7. The flash memory cell according to claim 1, wherein said fourth gate insulating layer is a capping oxide layer.

8. The flash memory cell according to claim 1, wherein electrons in said control gate are erased by tunneling.

9. A flash memory cell comprising:

a semiconductor substrate;

a drain region positioned in a first surface portion of said semiconductor substrate;

a source region positioned in a second surface portion of said semiconductor substrate, a channel region being defined at a surface portion of said semiconductor substrate positioned between said drain region and said source region;

a floating gate positioned over said channel region, said floating gate storing electrons from said drain region that represent data;

an erasing gate positioned above said source region and adjacent said floating gate;

a barrier insulating layer positioned above said source region, said barrier insulating layer completely covering said source region, separating said source region from said erasing gate and said floating gate, and being adjacent to said erasing gate;

a first gate insulating layer separating said floating gate from said drain region; and a second gate insulating layer separating said floating gate from said erasing gate.

10. The flash memory cell recited by claim 9, further comprising:

a control gate positioned above said floating gate;

a third gate insulating layer separating said floating gate from said control gate; and a sidewall spacer positioned adjacent said control gate, said sidewall spacer separating said control gate from said erasing gate.

11. The flash memory cell recited by claim 10, wherein said first gate insulating layer and said third gate insulating layer have comparable thicknesses.

12. The flash memory cell recited by claim 10, wherein said first gate insulating layer is 200–400 Angstroms thick, and said third gate insulating layer is 200–300 Angstroms thick.

13. The flash memory cell recited by claim 10, further comprising:

a fourth gate insulating layer positioned above said control gate and separating said control gate from said erasing gate.

14. The flash memory cell recited by claim 9, wherein said electrons stored in said floating gate are discharged by said erasing gate through said third gate insulating layer.

15. The flash memory cell recited by claim 14, wherein said electrons stored in said floating gate are supplied by said drain region through said first gate insulating layer.

* * * * *